United States Patent
Hsu et al.

(10) Patent No.: US 9,306,045 B2
(45) Date of Patent: Apr. 5, 2016

(54) SEMICONDUCTOR POWER DEVICE

(71) Applicant: UNITED MICROELECTRONICS CORP., Hsinchu (TW)

(72) Inventors: Wei-Lun Hsu, Hsinchu County (TW); Chung-Yi Chiu, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/083,551

(22) Filed: Nov. 19, 2013

(65) Prior Publication Data

US 2015/0137176 A1    May 21, 2015

(51) Int. Cl.
*H01L 29/66* (2006.01)
*H01L 29/739* (2006.01)
*H01L 29/08* (2006.01)

(52) U.S. Cl.
CPC ........ *H01L 29/7395* (2013.01); *H01L 29/0834* (2013.01)

(58) Field of Classification Search
CPC ........ H01L 29/7395–29/7397; H01L 29/0696; H01L 29/00; H01L 21/00; H01L 29/66333
USPC .......... 257/139, 500, 200, E27.046, E27.076, 257/E29.044, E29.001, E29.027, E29.066, 257/E21.382, E29.197; 438/133, 142, 170, 438/189, 309, FOR. 165–FOR. 166
See application file for complete search history.

(56) References Cited

U.S. PATENT DOCUMENTS

| | | | | |
|---|---|---|---|---|
| 5,162,876 A | * | 11/1992 | Kitagawa | H01L 29/0804 257/133 |
| 5,216,275 A | | 6/1993 | Chen | |
| 5,286,655 A | * | 2/1994 | Tsunoda | 438/492 |
| 6,066,878 A | | 5/2000 | Neilson | |
| 2004/0124465 A1 | * | 7/2004 | Onishi | H01L 29/0634 257/341 |
| 2008/0246085 A1 | * | 10/2008 | Saito | H01L 29/0634 257/342 |
| 2011/0254050 A1 | * | 10/2011 | Udrea et al. | 257/140 |

OTHER PUBLICATIONS

Green, et al., "Influence of Temperature and Doping Parameters on the Performance of Segmented Anode NPN (SA-NPN) LIGBT", 2004, pp. 285-287, Proceedings of 2004 International Symposium on Power Semiconductor Devices & ICs, Kitakyushu.

Hardikar, et al., "A Fast Switching Segmented Anode NPN Controlled LIGBT", Nov. 2003, pp. 701-703, vol. 24, No. 11, IEEE Electron Device Letters.

* cited by examiner

*Primary Examiner* — Thao X Le
*Assistant Examiner* — Nduka Ojeh
(74) *Attorney, Agent, or Firm* — WPAT, PC; Justin King

(57) ABSTRACT

A semiconductor power device is provided, comprising a substrate of a first conductive type, a buffering layer of a second conductive type formed on the substrate, a voltage supporting layer formed on the buffering layer, and alternating sections of different conductive types formed at the substrate. The voltage supporting layer comprises first semiconductor regions of the first conductive type and second semiconductor regions of the second conductive type, wherein the first semiconductor regions and the second semiconductor regions are alternately arranged. The alternating section and the buffering layer form a segmented structure of alternated conductive types, which is used as an anode of the semiconductor device.

17 Claims, 1 Drawing Sheet

SEMICONDUCTOR POWER DEVICE

BACKGROUND

1. Technical Field

The disclosure relates in general to a semiconductor power device, and more particularly to a high voltage semiconductor power device with segmented anode.

2. Description of the Related Art

A semiconductor power device is a semiconductor device used as a switch or rectifier in power electronics; for example, a switch-mode power supply. Such a device is also called a power device or a power IC (when used in an integrated circuit). The Insulated-gate bipolar transistor (IGBT) was developed and became widely available nowadays. Component of the IGBT has the power handling capability of the bipolar transistor and the advantages of the isolated gate drive of the power MOSFET.

The IGBT design is still under development and can be expected to provide increases in operating voltages. A super junction IGBT has been provided to achieve this major improvement over the conventional MOSFET structure by employing the super junction charge-balance principle, thereby reducing the electrical resistance to electron flow without compromising the breakdown voltage. However, it is still desirable to develop a semiconductor power device (such as the super junction IGBT) with improved characteristics, such as the decreased speed of turn-off during switching.

SUMMARY

The disclosure is directed to a semiconductor power device, having a segmented anode at the side of the substrate, which is capable of improving the switch speed and reducing the switch loss of the semiconductor power device, thereby improving the electrical properties of the device.

According to the disclosure, a semiconductor power device is provided, comprising a substrate of a first conductive type, a buffering layer of a second conductive type formed on the substrate, a voltage supporting layer formed on the buffering layer, and alternating sections of different conductive types formed at the substrate. The voltage supporting layer comprises first semiconductor regions of the first conductive type and second semiconductor regions of the second conductive type, wherein the first semiconductor regions and the second semiconductor regions are alternately arranged. The alternating section and the buffering layer form a segmented structure of alternated conductive types, which is used as an anode of the semiconductor device.

Figure 1:
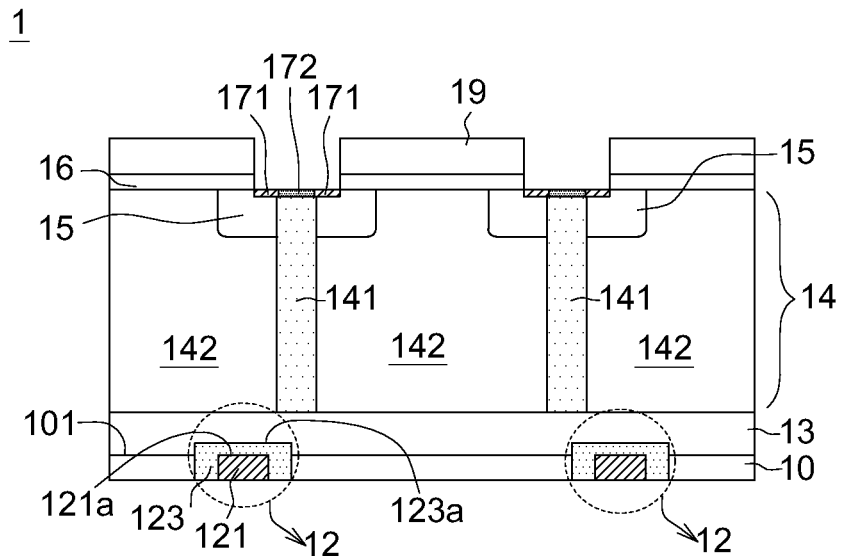
FIG. 1 schematically illustrates a semiconductor power device according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a semiconductor power device having segmented anode is provided. The semiconductor power device can be a super junction IGBT (Insulated Gate Bipolar Transistor), or other high voltage semiconductor power device. According to an embodiment, an anode is constructed at the side of the substrate and comprises a segmented N-P-N structure. The use of the segmented N-P-N structure as anode of the IGBT reduces amount of holes injected and electron recombination. Accordingly, the turn-off time of the IGBT is significantly decreased, which improves the switch speed of the semiconductor power device consequently. Thus, the structure of the embodiment reduces the switch loss of the semiconductor power device by improving the switch speed.

Embodiments are provided hereinafter with reference to the accompanying drawings for describing the related configurations, but the present disclosure is not limited thereto. The identical and/or similar elements of the embodiments are designated with the same and/or similar reference numerals. It is also important to point out that the illustrations may not be necessarily be drawn to scale. Thus, the specification and the drawings are to be regard as an illustrative sense rather than a restrictive sense.

Two embodiments are provided hereinafter with reference to the accompanying drawings for describing the related procedures, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated.

First Embodiment

FIG. 1 schematically illustrates a semiconductor power device according to the first embodiment of the present disclosure. The semiconductor power device 1 at least comprises a substrate 10 of a first conductive type (such as P type, P+), a buffering layer 13 of a second conductive type (such as N type) formed on the substrate 10, a voltage supporting layer 14 formed on the buffering layer 13, and an alternating section 12 of different conductive types formed at the substrate 10. According to the embodiment, the alternating section 12 and the buffering layer 13 form a segmented structure of alternated conductive types (ex: N-P-N) for being an anode of the semiconductor device 1.

In the embodiment, P type and N type are exemplified as the first conductive type and the second conductive type, respectively.

In the embodiment, the voltage supporting layer 14 on the buffering layer 13 comprises plural first semiconductor regions 141 of the first conductive type (such as P type, P−) and plural second semiconductor regions 142 of the second conductive type (such as N type, N−). The first semiconductor regions 141 and the second semiconductor regions 142 are alternately arranged for constructing the super junction.

As shown in FIG. 1, two alternating sections 12 are illustrated, and each alternating section 12 of the embodiment includes a first section 121 of the second conductive type (such as N type, N+) formed at the substrate 10, and a second section 123 of the first conductive type (such as P type, P+) formed at the substrate 10 and enclosing the first section 121. Therefore, the first section 121 is separated from the substrate 10 by the second section 123. In one embodiment, the second section 123 has an inverted-U cross-sectional shape for enclosing the first section 121.

In one embodiment, the top surface 123a of the second section 123 is higher than the top surface 101 of the substrate 10. In one embodiment, the top surface 121a of the first section 121 is substantially aligned with the top surface 101 of the substrate 10. However, the configurations of the first section 121 and the second section 123 can be modified and not limited to the illustration of FIG. 1.

Moreover, in one embodiment, a doping concentration of the first section 121 (ex: N+) is higher than a doping concentration of the buffering layer 13 (ex: N). In one embodiment, a doping concentration of the second section 123 (ex: P-base) is lower than a doping concentration of the substrate 10 (ex: P+). In one embodiment, a doping concentration of the buffering layer 13 (ex: N) is higher than a doping concentration of the second semiconductor region 142 (ex: N−).

According to the embodiment, the first section 121 (such as N type, N+), the second section 123 (such as P type, P+) and the buffering layer 13 (such as N type) constitute an N-P-N segmented anode of the semiconductor power device 1.

In the embodiment, the semiconductor power device 1 further comprises the base regions 15 of the first conductive type (such as P type, P-base) formed within the second semiconductor regions 142, and the base regions 15 extend down from the surfaces of the second semiconductor regions 142. The first semiconductor regions 141 of the first conductive type (such as P type, P−) penetrate the base regions 15, and are substantially vertical to the substrate 10.

In the first embodiment, the first semiconductor regions 141 are shaped as pillars, and the first semiconductor regions 141 extend downwardly and contact the buffering layer 13.

Furthermore, a patterned insulating layer 16 is formed on the voltage supporting layer 14, and a patterned conductive layer is formed on the patterned insulating layer 16 for providing a source region and a gate region. As shown in FIG. 1, the semiconductor power device 1 of the embodiment further comprises a source region formed at the base region 15, and a gate region having a gate electrode 19 formed on the voltage supporting layer 14. In the embodiment, the source region comprises two of the first portions 171 of the second conductive type (such as N type, N+), and a second portion 172 of the first conductive type (such as P type, P+) disposed between the first portions 171. In FIG. 1, the gate electrode 19 is formed on the voltage supporting layer and positioned adjacent to the source region. In one embodiment, the gate electrode 19 is positioned adjacent to one of the two first portions 171, and partially overlaps the base region 15.

In one embodiment, one end of the first semiconductor region 141 of the voltage supporting layer 14 connects the second portion 172 of the source region, as shown in FIG. 1. In one embodiment, a doping concentration of the first semiconductor region 141 is lower than a doping concentration of the second portion 172 of the source region.

In subsequent process, metal contacts on the alternating section 12 at the substrate 10 and the source region are fabricated for forming a drain and a source of a cell, respectively. According to one embodiment, a gate electrode 19 of the semiconductor power device may control two cells, as shown in FIG. 1.

In the conventional IGBT device, the anode is positioned above the voltage supporting layer 14, which is opposite to the substrate. When a voltage is applied to the conventional IGBT device, the current flows upwardly from the substrate to the anode. When the conventional IGBT device is turned off, the charge plasma within the drift region and the substrate needs to be removed, whereas the electrons are removed either by recombination within the drift region or injection holes into the anode. The conventional IGBT device suffers from high switch loss due to the minority carrier remove issue. According to the embodiment, a super junction IGBT device is provided by constructing an N-P-N segmented anode at the side of the substrate. When a voltage is applied to the IGBT device of the embodiment, the current flows downwardly to the anode of the substrate. According to the embodiment, the use of the segmented N-P-N structure as the anode reduces holes and electrons recombination, and a narrow P-base of the segmented N-P-N structure provides a path for electrons to be extracted from the drift region; therefore, the turn-off time is reduced significantly. Thus, the switch loss of the device of the embodiment is reduced by improving the switch speed (ex: reducing switch-off time).

Second Embodiment

Figure 2:
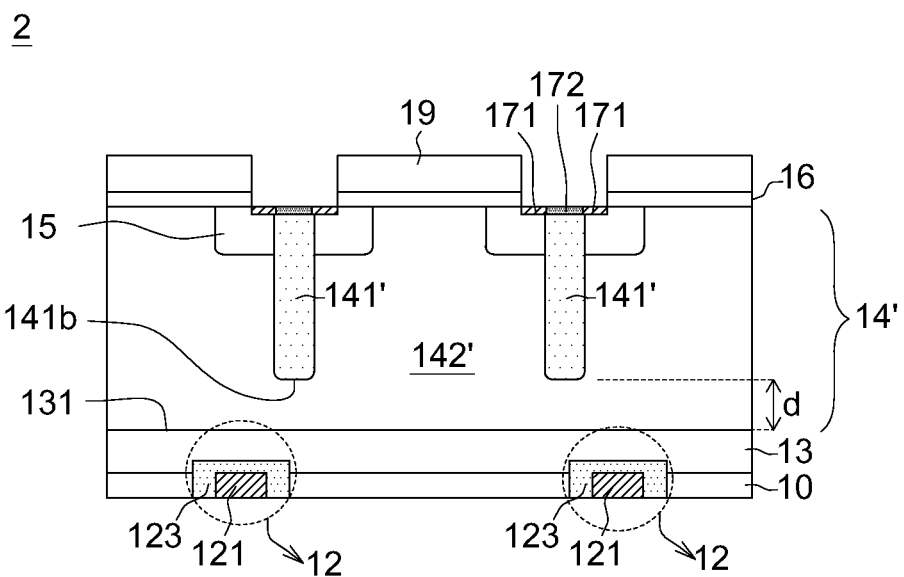
FIG. 2 schematically illustrates a semiconductor power device according to the second embodiment of the present disclosure.

FIG. 2 schematically illustrates a semiconductor power device according to the second embodiment of the present disclosure. The identical/similar elements of the first and second embodiments are designated with the same/similar reference numerals. The semiconductor power device 2 of the second embodiment is identical to the semiconductor power device 1 of the first embodiment, except for the voltage supporting layer 14'.

In the second embodiment, the voltage supporting layer 14' on the buffering layer 13 comprises the first semiconductor regions 141' of the first conductive type (such as P type, P−) and the second semiconductor regions 142' of the second conductive type (such as N type, N−). The first semiconductor regions 141' and the second semiconductor region 142' are substantially alternated in an arrangement for constructing the super junction.

In the first embodiment, the first semiconductor regions 141 shaped as pillars are extended downwardly to contact the buffering layer 13. However, the disclosure is not limited thereto. The arrangement of the first semiconductor regions and the second semiconductor regions of the voltage supporting layer can be modified without departing from the spirit of the disclosure and meets the requirements of the practical applications. In the second embodiment, the first semiconductor regions 141' shaped as pillars are extended downwardly, and the bottoms 141b of the first semiconductor regions 141' are spaced apart from the surface 131 of the buffering layer 13, such as a distance d as shown in FIG. 2.

Please refer to the descriptions in the first embodiment for the details of the identical elements in the construction of the semiconductor power device 2, and the details are not redundantly repeated herein.

The present disclosure could be applied to a semiconductor power device, particularly, a device having super junction MOSFET. According to the aforementioned descriptions, a semiconductor power device (ex: super junction IGBT) is provided by constructing an N-P-N segmented anode correspondingly at the side of the substrate. The current flows downwardly to the anode at the substrate when the device of the embodiment is turned on. The structures of the embodiments improve the switch speed (ex: reducing the turn-off time) and reduce the switch loss. Therefore, the structures provided in the embodiments are able to solve the high switch loss issue occurred in the conventional device. The electrical characteristics of the devices of the embodiments are greatly improved consequently.

Other embodiments with different configurations of the devices of the first and second embodiments are also applicable, which could be varied depending on the actual needs of the applications. It is, of course, noted that the configurations of FIG. 1 and FIG. 2 are depicted only for demonstration, not for limitation. For example, the alternating sections 12 can be positioned correspondingly to the base regions 15 (as shown in FIG. 1 and FIG. 2), or can be positioned correspondingly to the first semiconductor regions 141 (ex: right beneath the first semiconductor regions 141), which are not particularly limited. It is known by people skilled in the art that the construction of the semiconductor power device can be adjusted and modified depending on the requirements and/or manufacturing methods of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor power device comprising
   a substrate of a first conductive type;
   a buffering layer of a second conductive type formed on the substrate;
   a voltage supporting layer formed on the buffering layer, and the voltage supporting layer comprising first semiconductor regions of the first conductive type and second semiconductor regions of the second conductive type, said first and second semiconductor regions being alternately arranged; and
   alternating sections of different conductive types formed at the substrate, comprising:
   a first section of the second conductive type formed at the substrate; and
   a second section entirely doped by the same doping concentration of the first conductive type of the first semiconductor regions, and the second section formed at the substrate covering and enclosing a top surface and sidewalls of the first section so as to separate said sidewalls of the first section from another section of the substrate of the first conductive type, wherein said another section of the substrate contacts the second section, and the top surface of the first section is substantially aligned with a top surface of the substrate, and a doping concentration of the second section of the first conductive type is different from a doping concentration of said another section of the substrate of the first conductive type, wherein said alternating section and the buffering layer form a segmented structure of alternated conductive types for being an anode of the semiconductor device.

2. The semiconductor power device according to claim 1, wherein a doping concentration of the first section is higher than a doping concentration of the buffering layer.

3. The semiconductor power device according to claim 1, wherein the doping concentration of the second section is lower than the doping concentration of said another section of the substrate.

4. The semiconductor power device according to claim 1, wherein the first section, the second section and the buffering layer constitute an N-P-N segmented anode.

5. The semiconductor power device according to claim 1, wherein a top surface of the second section is higher than a top surface of the substrate.

6. The semiconductor power device according to claim 1, wherein the second section has an inverted-U cross-sectional shape for enclosing the first section.

7. The semiconductor power device according to claim 1, further comprising:
   base regions of the first conductive type formed within the second semiconductor regions and extending down from surfaces of the second semiconductor regions,
   wherein said first semiconductor regions of the first conductive type vertically penetrate the base regions.

8. The semiconductor power device according to claim 7, wherein said first semiconductor regions are shaped as pillars, and bottoms of said pillars are spaced apart from the buffering layer.

9. The semiconductor power device according to claim 7, wherein said first semiconductor regions are shaped as pillars, and said pillars contact the buffering layer.

10. The semiconductor power device according to claim 7, further comprising
    a source region, formed at the base region; and
    a gate electrode, formed on the voltage supporting layer and positioned adjacent to the source region, and the gate electrode partially overlapping the base region.

11. The semiconductor power device according to claim 10, wherein the source region comprising:
    two of first portions of the second conductive type;
    a second portion of the first conductive type disposed between the first portions.

12. The semiconductor power device according to claim 11, wherein the gate electrode is adjacent to one of said two first portions.

13. The semiconductor power device according to claim 11, wherein one end of the first semiconductor region connects the second portion of the source region.

14. The semiconductor power device according to claim 13, wherein a doping concentration of the first semiconductor region is lower than the doping concentration of the second portion.

15. The semiconductor power device according to claim 7, wherein a doping concentration of the buffering layer is higher than a doping concentration of the second semiconductor region.

16. The semiconductor power device according to claim 1, wherein the first conductive type is P type while the second conductive type is N type.

17. The semiconductor power device according to claim 1, wherein the doping concentration of the second section is higher than a doping concentration of the first semiconductor regions of the voltage supporting layer.

* * * * *